US009791985B2

(12) United States Patent
Chandran et al.

(10) Patent No.: US 9,791,985 B2
(45) Date of Patent: Oct. 17, 2017

(54) CROSS HATCH ITO SENSOR PATTERN FOR TOUCHSCREENS

(71) Applicant: STMicroelectronics Asia Pacific Pte Ltd, Singapore (SG)

(72) Inventors: Praveesh Chandran, Singapore (SG); Ravi Bhatia, Singapore (SG)

(73) Assignee: STMICROELECTRONICS ASIA PACIFIC PTE LTD, Singapore (SG)

( * ) Notice: Subject to any disclaimer, the term of this patent is extended or adjusted under 35 U.S.C. 154(b) by 0 days.

(21) Appl. No.: 14/803,190

(22) Filed: Jul. 20, 2015

(65) Prior Publication Data

US 2017/0024033 A1 Jan. 26, 2017

(51) Int. Cl.
*G06F 3/044* (2006.01)
*H05K 1/02* (2006.01)
*H05K 1/09* (2006.01)

(52) U.S. Cl.
CPC ........... *G06F 3/044* (2013.01); *H05K 1/0296* (2013.01); *H05K 1/09* (2013.01); *G06F 2203/04111* (2013.01)

(58) Field of Classification Search
CPC .......... G06F 3/044; G06F 3/045; G06F 3/047; G06F 2203/04102; G06F 2203/04103; G06F 2203/04111–2203/04113; G06F 3/041; G06F 3/0412; G06F 3/0416
See application file for complete search history.

(56) References Cited

U.S. PATENT DOCUMENTS

| | | |
|---|---|---|
| 2009/0194344 A1 | 8/2009 | Harley et al. |
| 2011/0007020 A1* | 1/2011 | Hong ................ G06F 3/044 345/174 |
| 2011/0025639 A1* | 2/2011 | Trend ................ G06F 3/044 345/174 |
| 2011/0148435 A1 | 6/2011 | Schwartz et al. |
| 2011/0227858 A1* | 9/2011 | An ................ G06F 3/044 345/174 |
| 2012/0044187 A1 | 2/2012 | Polishchuk et al. |
| 2012/0327012 A1 | 12/2012 | Hoch |
| 2014/0022466 A1 | 1/2014 | Lo et al. |
| 2014/0078068 A1* | 3/2014 | Jones ................ G06F 3/044 345/173 |
| 2014/0225859 A1 | 8/2014 | Badaye et al. |

* cited by examiner

*Primary Examiner* — Nathan Danielsen
(74) *Attorney, Agent, or Firm* — Gardere Wynne Sewell LLP

(57) ABSTRACT

In one implementation, a capacitive sensing structure comprises rows of first sensors electrically coupled together and columns of second sensors electrically coupled together, wherein the first sensors include: a first arm extending in a first direction and having a first plurality of finger structures extending therefrom, a second arm extending in the first direction and having a second plurality of finger structures extending therefrom, and an end portion connecting the arms, wherein the first sensors define open regions that are occupied by the second sensors. In a second implementation, a capacitive sensing structure comprises rows of first sensors and columns of second sensors, wherein each of the first sensors includes an elongated portion having finger structures extending therefrom, and wherein each of the second sensors includes a primary portion connected to secondary portions via arms, wherein the secondary portions occupy gaps defined by the finger structures of the first sensors.

27 Claims, 6 Drawing Sheets

CROSS HATCH ITO SENSOR PATTERN FOR TOUCHSCREENS

FIELD OF THE INVENTION

The present disclosure generally relates to capacitive touchscreen panels and, more particularly, to a cross hatch indium tin oxide (ITO) sensor pattern for use in capacitive touchscreens.

BACKGROUND

Reference is now made to FIG. 1 which illustrates a prior art diamond-shaped sensor pattern 100 for use in a capacitive touchscreen. The sensor pattern 100 includes a first set of diamond-shaped sensors 102, often referred to in the art as the "Yforce" or transmit electrode structure. The sensors 102 are arranged in a matrix such that sensors 102 in each column are connected to each other by a connecting member 104. The sensors 102 in adjacent columns are isolated from each other. The sensor pattern 100 also includes a second set of diamond-shaped sensors 112, often referred to in the art as the "Xsense" or receive electrode structure. The sensors 112 are arranged in a matrix such that sensors 112 in each row are connected to each other by a connecting member 114. The sensors 112 in adjacent rows are isolated from each other.

The matrix of the diamond-shaped sensors 102 is interleaved with the matrix of diamond-shaped sensors 112 in a manner where the space between a group of four diamond-shaped sensors 102 is occupied by one of the diamond-shaped sensors 112, and the space between a group of four diamond-shaped sensors 112 is occupied by one of the diamond-shaped sensors 102.

In some embodiments, the first and second sets of sensors 102 and 112 and connecting members 104 and 114 are made of a single patterned material layer, wherein connecting members 104 provide bridged connections to sensors 102 over the connecting members 114, or connecting members 114 provide bridged connections to sensors 112 over the connecting members 104. In other embodiments, the sensors 102 and connecting members 104 are made of a first patterned material layer, and the sensors 112 and connecting members 114 are made of a second patterned material layer. In the embodiments discussed herein, the material layers may comprise relevant materials known in the art such as, for example, indium tin oxide (ITO), and may be supported by a transparent substrate layer.

In embodiments wherein the sensor pattern comprises multiple material layers, the first and second patterned material layers are isolated from each other by an interposed insulating layer. The first patterned material layer including diamond-shaped sensors 102 and connecting members 104 may comprise the lower layer of the capacitive touchscreen, and the second patterned material layer including diamond-shaped sensors 112 and connecting members 114 may comprise the upper layer (as shown in FIG. 1), or vice versa. The insulating layer, first patterned material layer, and second patterned material layer are supported by a transparent substrate layer.

The prior art diamond-shaped sensor pattern described above typically overlays a display screen in a stacked configuration. Commonly, that display screen is a liquid crystal display (LCD) although other display technologies may also be used. In operation, these prior art diamond-shaped patterns can suffer from an unacceptable amount of noise captured from the underlying LCD display screen.

Additionally, there is room for improvement with respect to sensitivity of the prior art diamond-shaped sensor patterns to capacitive touches (or proximity detections), particularly when an object having a small contact surface area, such as an active or passive stylus, is used to interface with the capacitive touchscreen. Furthermore, as touchscreen panels are manufactured to be increasingly thinner, performance is increasingly affected by the design and shape of the sensor pattern, both in single layer and multi-layer stack configurations.

Although some custom touch sensor patterns exist, such designs typically suffer in thin stack arrangements, particularly with regard to performance, pattern visibility, and ITO manufacturing. A need accordingly exists in the art for improved sensor patterns for use in single layer and multi-layer stack configurations of capacitive touchscreens.

SUMMARY

The present disclosure provides a capacitive sensing structure, comprising: one or more rows of first electrically conductive sensor structures; and one or more columns of second electrically conductive sensor structures electrically coupled together; wherein each row of the first electrically conductive sensor structures comprises: a first arm extending in a first direction and having a first plurality of finger structures extending from the first arm along a second direction, a second arm extending in the first direction and having a second plurality of finger structures extending from the second arm along the second direction, and an end portion connecting the first and second arms at a first end of the row of the first electrically conductive sensor structures, wherein one or more of the first arm, second arm, first plurality of finger structures, second plurality of finger structures, and end portion at least partially define a plurality of open regions.

In another embodiment, the present disclosure provides a capacitive sensing structure, comprising: one or more rows of first electrically conductive sensor structures electrically coupled together; and one or more columns of second electrically conductive sensor structures electrically coupled together; wherein each of the first electrically conductive sensor structures comprises: an elongated portion extending along a first direction, and a plurality of finger structures extending from the elongated portion along a second direction and defining gaps between adjacent finger structures, and wherein each of the second electrically conductive sensor structures comprises: a primary portion extending along the second direction, and a plurality of secondary portions coupled to the primary portion, wherein each of the secondary portions extend along the second direction to occupy at least a portion of one or more of the gaps defined by adjacent finger structures of one or more of the first electrically conductive sensor structures.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

Figure 2:
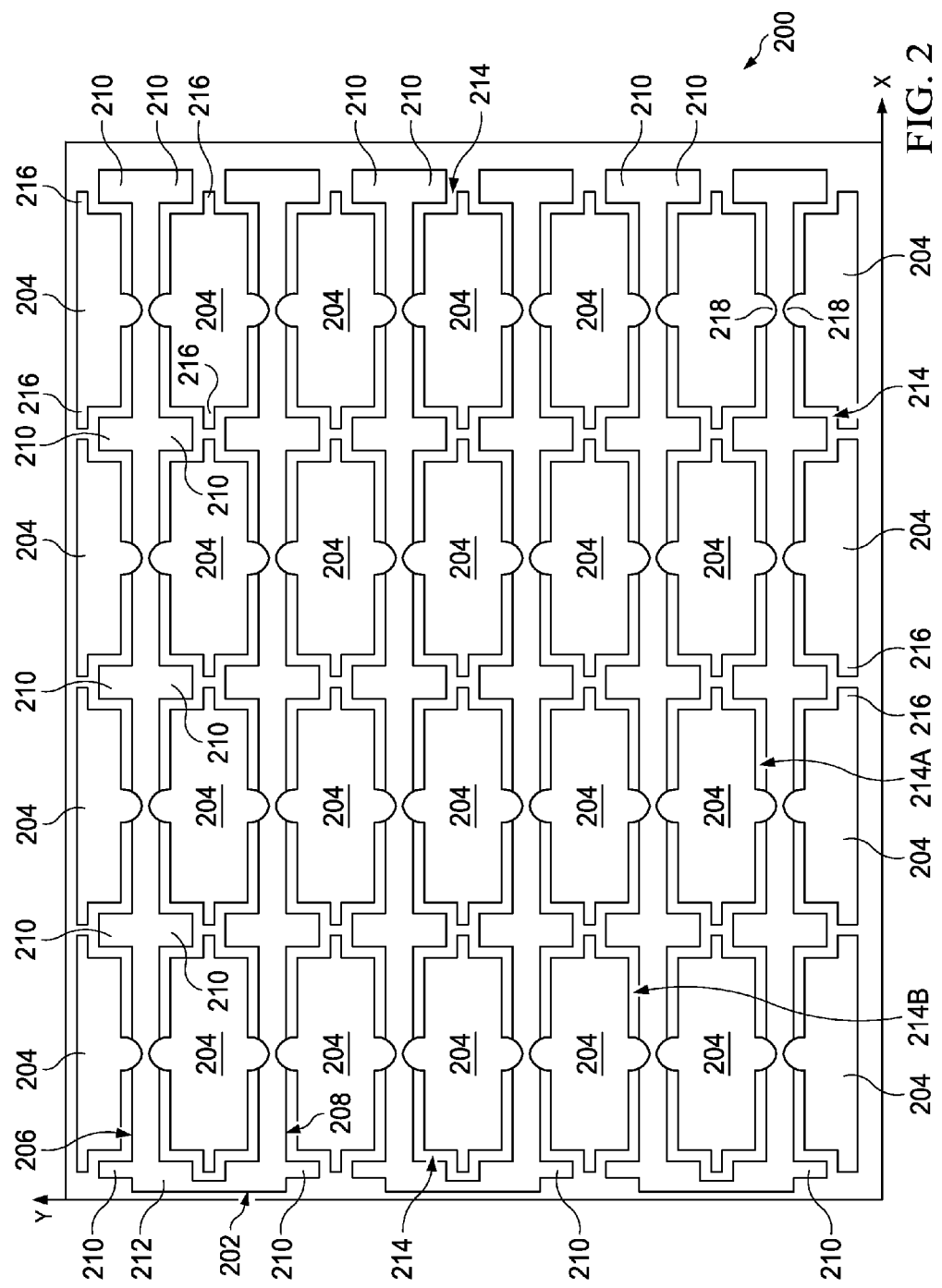
FIG. 2 illustrates an example embodiment of a sensor pattern for use in a capacitive touchscreen application.

Reference is now made to FIG. 2, which illustrates an example embodiment of a sensor pattern 200 for use in detecting a touch in a capacitive touchscreen application. The sensor pattern 200 includes rows of electrically conductive sensor structures 202 (also referred to herein as receiving sensors) extending across the touchscreen panel in a first direction (e.g., horizontally), and columns of electrically conductive sensor structures 204 (also referred to herein as transmit sensors) extending across the touchscreen panel in a second direction (e.g., vertically). Each row of sensor structures 202 is electrically isolated from the other rows of sensor structures 202, and each column of sensor structures 204 is electrically isolated from the other columns of sensor structures 204.

As shown in FIG. 2, each row of sensor structures 202 includes a first arm 206 and a second arm 208, wherein the first arm 206 and second arm 208 extend across the columns of transmit sensors 204 and in parallel to each other. Both the first arm 206 and second arm 208 extend horizontally along the first direction and have finger structures 210 extending vertically, from the respective first arm 206 or second arm 208, along the second direction. Each first arm 206 and second arm 208 includes finger structures 210 extending vertically above the respective arm 206/208 and finger structures 210 extending vertically below the respective arm 206/208. In the embodiment illustrated in FIG. 2, the finger structures 210 extending vertically above the arm 206/208 are symmetrically opposed with respect to the finger structures 210 extending vertically below the arm 206/208.

In the embodiment illustrated in FIG. 2, the first and second arms 206 and 208 each terminate with finger structures 210 disposed at one end of the respective first or second arm 206 or 208. The opposite end of the row of sensor structures 202 includes an end portion 212 providing a connection between the first arm 206 and the second arm 208.

Figure 3:
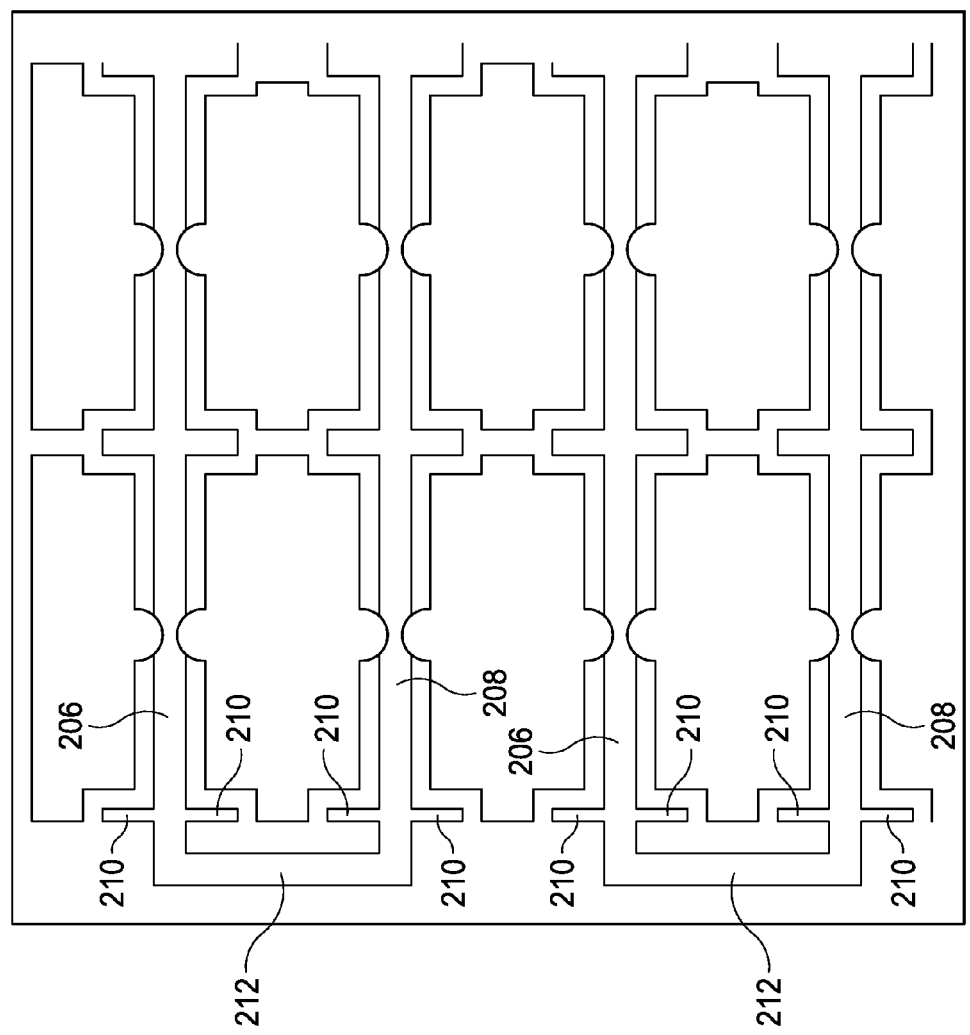
FIG. 3 illustrates an alternate embodiment of an end portion for the sensor pattern illustrated in FIG. 2.

Referring briefly to FIG. 3, the end portion 212 may, in some embodiments, be separate from finger structures 210 located proximate the end portion 212. In other embodiments, such as that shown in FIG. 2, the end portion 212 may be integrated with the finger structures 210 located proximate the end portion 212.

Referring again to FIG. 2, one or more of the first arm 206, second arm 208, finger structures 210, and end portion 212 at least partially define open regions 214. Disposed within the open regions 214 are respective ones of the columns of electrically conductive sensors 204 (also referred to herein as transmit sensors 204). As shown in FIG. 2, an open region 214 may be defined by components of a single row of receiving sensors 202 (see, for example, open region 214A), or may be defined by components of two adjacent rows of receiving sensors 202 (see, for example, open region 214B).

Each column of electrically conductive sensor structures 204 includes a plurality of series-connected transmit sensors 204, wherein each transmit sensor 204 is located within one of the open regions 214 and includes a generally rectangular shape (although other shapes could be used). The shape of the transmit sensors 204 is designed such that a perimeter of the transmit sensor 204 generally follows a perimeter of adjacent receiving circuitry (i.e., portions of adjacent rows of sensor structures 202). In the embodiment illustrated in FIG. 2, this is achieved by conforming the shape of the transmit sensor 204 to the shape of the open region 214 within which the respective transmit sensor 204 is disposed. For example, each transmit sensor 204 includes one or more horizontal protrusions 216, wherein the horizontal protrusions 216 are disposed adjacent one or more of the finger structures 210.

Figure 4:
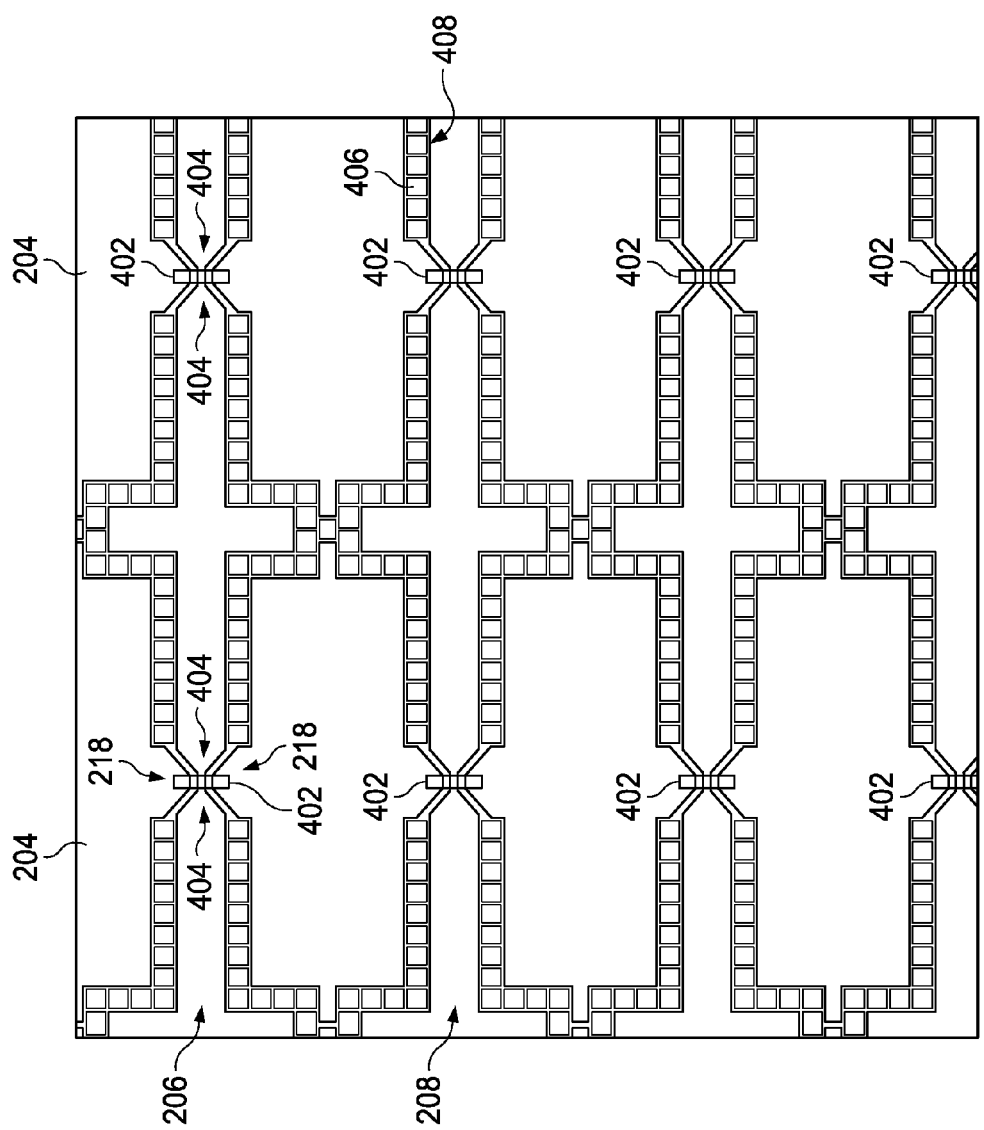
FIG. 4 illustrates a detailed view of the sensor pattern illustrated in FIG. 2.

To reduce thickness of the touchscreen panel, the disclosed sensor pattern 200 may comprise a single patterned material layer, wherein connecting members provide bridged connections to transmit sensors 204 in a column. For example, as shown in FIG. 4, each transmit sensor 204 includes one or more vertical protrusions 218, and an electrical bridge 402 connects the vertical protrusions 218 of adjacent transmit sensors 204 in a column. The electrical bridge 402 may comprise ITO, an insulator metal, or other material, and is disposed such that it connects the vertical protrusions 218 of adjacent transmit sensors 204 over one of the first or second arms 206 or 208 of a receiving sensor 202. It should be appreciated that, in other embodiments, bridged connections may instead be provided between sections of the first or second arms 206 or 208, wherein the bridged connections are disposed over the vertical protrusions 218 of transmit sensors 204 to connect the sections of the respective first or second arm 206 or 208.

Although the sensor pattern 200 is designed to be implemented as a single layer, one glass solution (OGS), it should be appreciated that the sensor pattern 200 is capable of being implemented in an embodiment comprising multiple patterned material layers. For example, the rows of receiving sensors 202 may comprise a first patterned material layer, and the columns of transmit sensors 204 may comprise a second patterned material layer, wherein the first and second patterned material layers are isolated from each other by an interposed insulating layer. In the embodiments discussed herein, the material layers and insulating layer may comprise relevant materials known in the art such as, for example, ITO, and may be supported by a transparent substrate layer.

FIG. 4 illustrates a detailed view of a portion of the sensor pattern 200 illustrated in FIG. 2. In addition to illustrating the electrical bridges 402, FIG. 4 shows that the first arm 206 and second arm 208 include tapered regions 404 that taper in conformity to the shape of the vertical protrusions 218 of adjacent transmit sensors 204. For example, in the embodiment illustrated in FIG. 4, the vertical protrusions 218 have a pointed shape and, accordingly, the tapered regions 404 taper in conformity with the pointed shape of the adjacent vertical protrusions 218. As such, the transmit sensor 204 and receive sensor 202 maintain a pattern wherein the perimeter of the transmit sensor 204 and the perimeter of the receive sensor 202 conform to each other.

As shown in FIG. 4, the sensor pattern 200 also includes, in some embodiments, a plurality of floating separators 406 disposed within a region 408 located generally between the perimeter of the transmit sensors 204 and the perimeter of the receiving sensors 202. The floating separators 406 are single, electrically conductive structures that are not electrically connected (i.e., electrically floating) to each other, to the transmit sensors 204, to the receiving sensors 202, or to any other structure of the sensor pattern 200. The floating separators 406 may be disposed along at least a portion of the perimeter of the transmit sensors 204, at least a portion of the perimeter of the receiving sensors 202, or some combination thereof. In embodiments in which the touchscreen panel includes multiple layers, the floating separators 406 may be included in any of the patterned material layers.

In some embodiments, the floating separators 406 are each comprised of the same material as the receiving sensors 202 and the transmit sensors 204 (e.g., ITO). Thus, the inclusion of floating separators 406, in combination with the sensor pattern 200, provides for a consistent visual effect to a user by eliminating or reducing open areas between the receiving sensors 202 and transmit sensors 204.

It should be appreciated, however, that the arrangement of floating separators 406 is merely exemplary of one way to arrange the plurality of floating separators 406 within the open regions 408. Furthermore, the use of square-shaped tiles for the plurality of floating separators 406 is exemplary. Other tile shapes, for example, round, triangular, hexagonal, rectangular, and the like, could instead be chosen.

Figure 1:
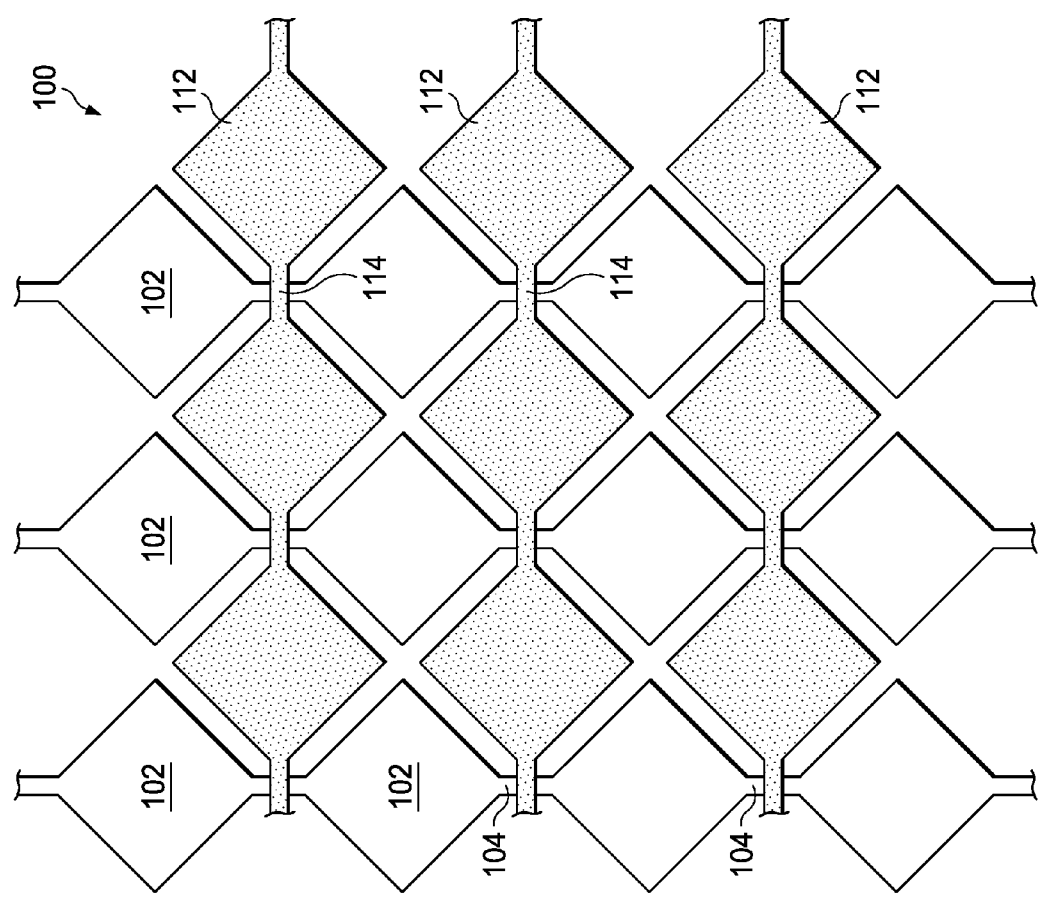
FIG. 1 illustrates a prior art diamond-shaped sensor pattern for use in a capacitive touchscreen.

The structures described herein provide a number of advantages in comparison to the prior art structures of FIG. 1. For example, the sensor pattern 200 has no curved shapes and, therefore, requires no special ITO manufacturing process. The sensor pattern 200 increases the perimeter of interaction between the receiving and transmitting sensors, thereby improving the sensitivity of the touch panel by increasing the mutual coupling between the receiving and transmitting sensors. Additionally, both the shape of the sensor pattern 200 and the use of floating separators 406 each reduces open regions, which aids in increasing the fringing fields, thereby increasing the sensitivity of the capacitive touchscreen panel. Moreover, designing the shape of the receiving sensor 202 to have a reduced surface area improves the floating effect, even with the use of a thin cover lens. Thus, accuracy and sensitivity to capacitive touches and proximity detections are improved, particularly for embodiments in which an object having a small contact surface area, such as a stylus, is used to interface with the capacitive touchscreen.

Figure 5:
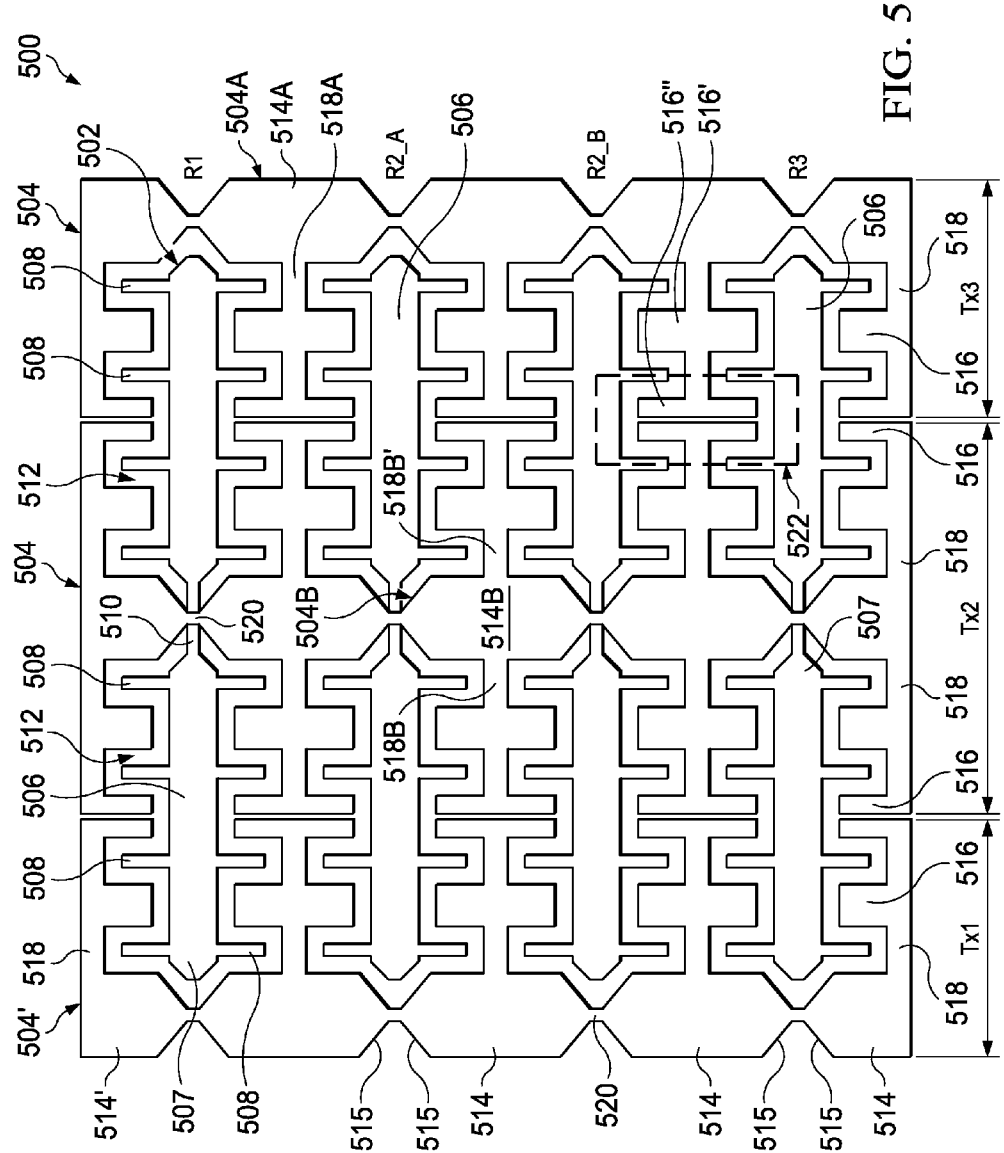
FIG. 5 illustrates another example embodiment of a sensor pattern for use in a capacitive touchscreen application.

Reference is now made to FIG. 5, which illustrates another example embodiment of a sensor pattern 500 for use in detecting a touch in a capacitive touchscreen application. The sensor pattern 500 includes rows of electrically conductive sensor structures 502 (also referred to herein as receiving sensors) extending across the touchscreen panel in a first direction (e.g., horizontally), and columns of electrically conductive sensor structures 504 (also referred to herein as transmit sensors) extending across the touchscreen panel in a second direction (e.g., vertically). Each row of sensor structures 502 is electrically isolated from the other rows of sensor structures 502, and each column of sensor structures 504 is electrically isolated from the other columns of sensor structures 504.

As shown in FIG. 5, each row of sensor structures 502 includes series-connected receiving sensors 502, wherein each of the receiving sensors 502 includes an elongated portion 506 extending horizontally along the first direction and a plurality of finger structures 508 extending, from the elongated portion 506, vertically along the second direction. The elongated portions 506 of each row of receiving sensors 502 terminate at a tapered end 507. Adjacent receiving sensors 502 are connected by a connecting member 510 extending between the tapered ends 507 of adjacent receiving sensors 502. Although the embodiment illustrated in FIG. 5 shows rows comprising two connected receiving sensors 502, it should be appreciated that a row may comprise more than two connected receiving sensors 502. For example, if the sensor pattern 500 comprises eight columns, then each row may have seven receiving sensors 502 connected in series.

Each elongated portion 506 includes finger structures 508 extending vertically above the elongated portion 506 and finger structures 508 extending vertically below the elongated portion 506. In the embodiment illustrated in FIG. 5, each elongated portion 506 includes eight finger structures 508, wherein four finger structures 508 extending vertically above the elongated portion 506 are symmetrically opposed with respect to four finger structures 508 extending vertically below the elongated portion 506. As shown in FIG. 5, adjacent finger structures 508 define gaps 512, which, as discussed below, are occupied by a portion of one or more of the transmit sensors 504.

Each column of electrically conductive sensor structures 504 includes a plurality of series-connected transmit sensors 504, wherein each transmit sensor 504 comprises a primary portion 514 and a plurality of secondary portions 516 coupled to the primary portion 514 by one or more arms 518. The primary portion 514 of each transmit sensor 504 has an elongated shape extending vertically along the second direction, wherein connecting ends of the primary portion 514 terminate at a tapered end 515. Transmit sensors 504 in a particular column are connected in series via connecting members 520, wherein adjacent transmit sensors 504 are connected by a connecting member 520 extending between the tapered ends 515 of the adjacent transmit sensors 504 in the column. Transmit sensors 504 located at the beginning or end of a column have a truncated elongated portion 514. For example, transmit sensor 504' is the first transmit sensor located in the first column and has an elongated portion 514' that is truncated at the arm 518.

In columns located along the border of the touchscreen, the transmit sensors 504 each have one arm 518 that extends toward the center of the touchscreen. For example, transmit sensor 504A is located along the border of the touchscreen and includes a first arm 518A extending horizontally from a first side of the primary portion 514A toward the center of the touchscreen. In columns that are not located along the border of the touchscreen, the transmit sensor 504 has two arms 518, wherein a first arm 518 extends horizontally from a first side of the primary portion 514 and a second arm 518 extends horizontally from a second side of the primary portion 514. For example, as shown in FIG. 5, transmit sensor 504B is located in an interior column and includes a first arm 518B extending from a first side of the primary portion 514B and a second arm 518B' extending from a second side of the primary portion 514B.

Secondary portions 516 extend vertically from the arms 518, wherein each arm 518 includes two secondary portions 516. As shown in FIG. 5, the secondary portions 516 include a larger secondary portion 516' and a smaller secondary portion 516". In some embodiments, the smaller secondary portion 516" is approximately half the size of the larger secondary portion 516', and is disposed at the end of arm 518, whereas the larger secondary portion 516' is disposed at the middle of the arm 518.

If the transmit sensor 504 is the first or last sensor 504 in the column, then the secondary portions 516 of the first or last sensor 504 in the column extend vertically toward the center of the touchscreen. For example, if the sensor 504 is the first sensor 504 located at the top of the column, then the secondary portions 516 extend vertically below the arms 518. Similarly, if the sensor 504 is the last sensor 504 located at the bottom of the column, then the secondary portions 516 extend vertically above the arms 518. If, however, the transmit sensor 504 is not the first or last sensor 504 in the column, then the secondary portions 516 extend vertically both above and below the respective arm 518.

As shown in FIG. 5, the secondary portions 516 extend from respective arms 518 and occupy gaps 512 defined by adjacent finger structures 508 of adjacent receiving sensors 502. In some instances, a gap 512 may be occupied by the secondary portions 516 of two separate transmit sensors 504, as shown in the box 522 indicated in FIG. 5. Thus, the shape of the transmit sensors 504 and receiving sensors 502 are generally designed such that the perimeters of the receiving sensors 502 follow the perimeter of adjacent transmit sensors 504, and vice versa.

In some embodiments, the sensor pattern 500 is designed to be implemented as a thin, two-layer glass-film-film (GFF) stack, wherein the sensor pattern 500 comprises multiple patterned material layers. For example, the rows of receiving sensors 502 may comprise a first patterned material layer, and the columns of transmit sensors 504 may comprise a second patterned material layer, or vice versa. In either implementation, the first and second patterned material layers are isolated from each other by an interposed insulating layer.

The sensor pattern 500 is capable of being implemented in a design having a cover glass thickness of 0.4 mm and an interposing insulating layer with a thickness of 50 um or less (e.g., 28 um). With an interposing layer having a thickness between 50 um-100 um and a cover glass thickness of 0.4 mm, the pattern 500 is capable of accurate touch detection with a 6 mm finger floating condition (i.e., where the floating condition is present with a 6 mm finger touch size when the touchscreen is ungrounded). Moreover, it is not desirable to implement such a stack arrangement using the sensor pattern 100 illustrated in FIG. 1, as such an arrangement would produce a large positive capacitance (large negative touch strength), which is undesirable. In the embodiments discussed herein, the material layers and insulating layer may comprise relevant materials known in the art such as, for example, ITO, and may be supported by a transparent substrate layer.

To further reduce thickness of the touchscreen panel, the disclosed sensor pattern 500 may, in some embodiments, comprise a single patterned material layer, wherein the connecting members 510 or connecting members 520 provide bridged connections. For example, the connecting members 510 may provide a bridged electrical connection over the transmit sensors 504 to connect adjacent receiving sensors 502 in a row. Alternatively, the connecting members 520 may provide a bridged connection over the connecting members 510 to connect adjacent transmit sensors 504 in a column. The electrical bridges provided by the connecting members 510/520 may comprise ITO, an insulator metal, or other material.

Figure 6:
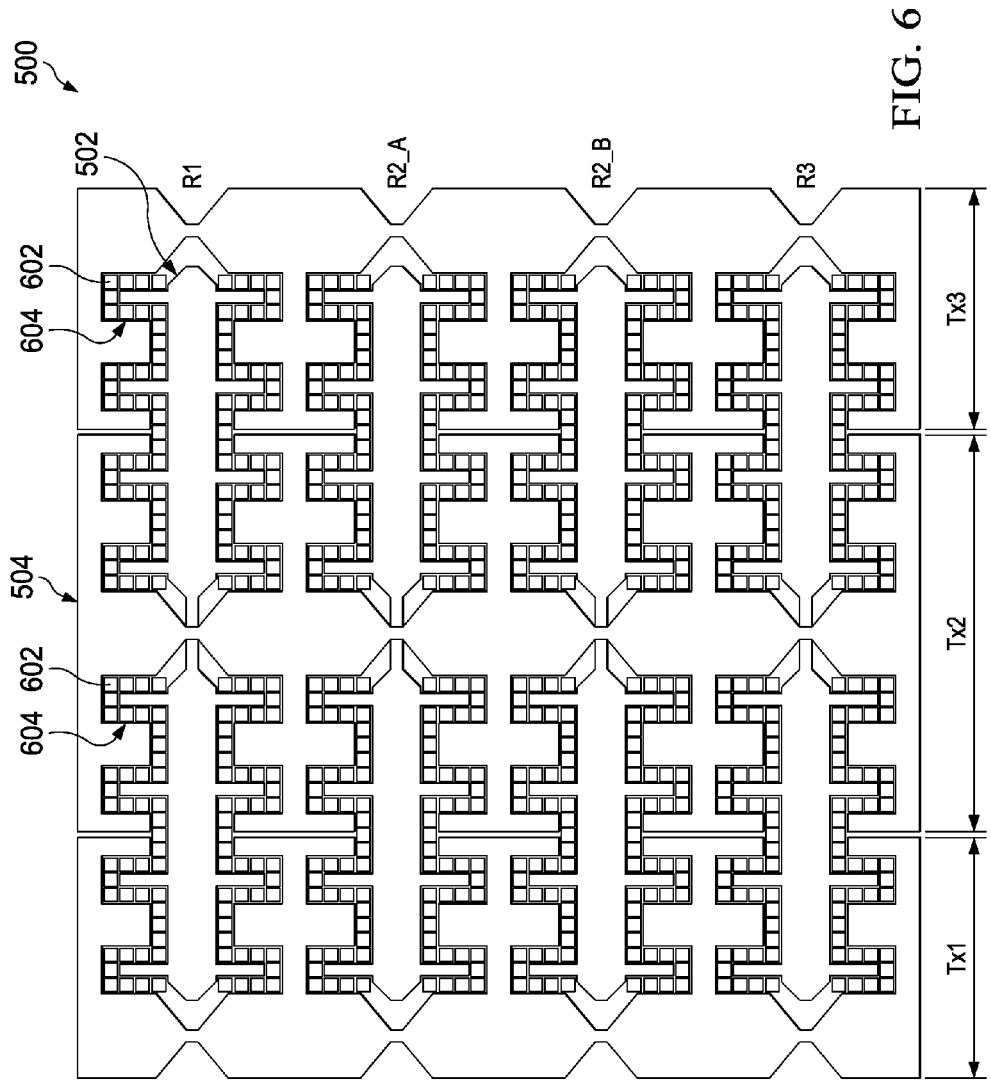
FIG. 6 illustrates an alternate embodiment of the sensor pattern illustrated in FIG. 5, wherein the sensor pattern further includes floating separators.

Referring now to FIG. 6, the sensor pattern 500 may also include, in some embodiments, floating separators 602 disposed within a region 604 located generally between the perimeter of the transmit sensors 504 and the perimeter of the receiving sensors 502. The floating separators 602 are single, electrically conductive structures that are not electrically connected (i.e., electrically floating) to each other, to the transmit sensors 504, to the receiving sensors 502, or to any other structure of the sensor pattern 500. The floating separators 602 may be disposed along at least a portion of the perimeter of the transmit sensors 504, at least a portion of the perimeter of the receiving sensors 502, or some combination thereof. In embodiments in which the touchscreen panel includes multiple layers, the floating separators 602 may be included in any of the patterned material layers.

In some embodiments, the floating separators 602 are each comprised of the same material as the receiving sensors 502 and the transmit sensors 504 (e.g., ITO). Thus, the inclusion of floating separators 602, in combination with the sensor pattern 500, provides for a consistent visual effect to a user by eliminating or reducing open areas between the receiving sensors 502 and transmit sensors 504.

It should be appreciated, however, that the arrangement of floating separators 602 is merely exemplary of one way to arrange the plurality of floating separators 602 within the open regions 604. Furthermore, the use of square-shaped tiles for the plurality of floating separators 602 is exemplary. Other tile shapes, for example, round, triangular, hexagonal, rectangular, and the like, could instead be chosen.

The structures described herein provide a number of advantages in comparison to the prior art structures of FIG. 1. For example, the sensor pattern 500 has no curved shapes and, therefore, requires no special ITO manufacturing process. The sensor pattern 500 increases the perimeter of interaction between the receiving and transmitting sensors, thereby improving the sensitivity of the touch panel by increasing the mutual coupling between the receiving and transmitting sensors. Additionally, the transmit sensors 504 are designed to be relatively wide to help shield LCD noise, whereas the receiving sensors 502 are designed to be relatively thin in order to reduce external noise encountered when a user finger contacts the touchscreen panel. Both the shape of the sensor pattern 500 and the use of floating separators 602 each reduces open regions, which aids in increasing the fringing fields, thereby increasing the sensitivity of the capacitive touchscreen panel. Moreover, designing the shape of the receiving sensors 502 to have a reduced surface area improves the floating effect, even with the use of a thin cover lens. Thus, accuracy and sensitivity to capacitive touches and proximity detections are improved, particularly for embodiments in which an object having a small contact surface area, such as a stylus, is used to interface with the capacitive touchscreen.

It should be appreciated that the disclosed embodiments of a touchscreen sensor pattern may be incorporated in a capacitive touchscreen application. As such, the disclosed structures may be used to detect a user touch (e.g., finger or stylus) in the capacitive touchscreen application. Therefore, the capacitive touchscreen may include additional circuitry or components for detecting and/or processing a user touch, and/or for performing various functions in response to a detected user touch. Such additional structure, operation of such structure, and operation of capacitive touch sensors in general (e.g., transmit sensors and receiving sensors) are disclosed in U.S. Patent Publication No. 2014/0191978 which is hereby incorporated by reference.

The foregoing description has provided by way of exemplary and non-limiting examples a full and informative description of one or more exemplary embodiments of this invention. However, various modifications and adaptations may become apparent to those skilled in the relevant arts in view of the foregoing description when read in conjunction with the accompanying drawings and the appended claims. However, all such and similar modifications of the teachings of this invention will still fall within the scope of this invention as defined in the appended claims.

What is claimed is:

1. A capacitive sensing structure, comprising:
one or more rows of first electrically conductive sensor structures; and
one or more columns of second electrically conductive sensor structures electrically coupled together;
wherein each row of the first electrically conductive sensor structures comprises:
a first arm extending in a first direction across each of the one or more columns of second electrically conductive sensor structures and having a first plurality of finger structures extending from the first arm along a second direction,
a second arm extending parallel to the first arm and across each of the one or more columns of second electrically conductive sensor structures, the second arm having a second plurality of finger structures extending from the second arm along the second direction, and
an end portion connecting the first and second arms at a first end of the row of the first electrically conductive sensor structures, wherein the end portion integrates with one of the first plurality of finger structures and one of the second plurality of finger structures,
wherein at least the first arm, second arm, first plurality of finger structures, and second plurality of finger structures at least partially define a plurality of open regions.

2. The capacitive sensing structure of claim 1, wherein each of the second electrically conductive sensor structures comprise a shape disposed within one of the plurality of open regions, wherein the shape is at least partially defined by a perimeter of the one of the plurality of open regions.

3. The capacitive sensing structure of claim 2, wherein the shape of one or more of the second electrically conductive sensor structures includes one or more horizontal protrusions each disposed adjacent one or more of the finger structures and extending from the second electrically conductive sensor structure along the first direction.

4. The capacitive sensing structure of claim 3, wherein the shape of one or more of the second electrically conductive sensor structures further includes one or more vertical protrusions extending from the second electrically conductive sensor structure along the second direction.

5. The capacitive sensing structure of claim 4, wherein at least one of the first arm and second arm of the row of first electrically conductive sensor structures includes a tapered region disposed adjacent one or more of the vertical protrusions of the second electrically conductive sensor structures.

6. The capacitive sensing structure of claim 5, wherein the shape of one or more of the second electrically conductive sensor structures further includes an electrical bridge extending between, and electrically connecting, adjacent vertical protrusions of the second electrically conductive sensor structures.

7. The capacitive sensing structure of claim 1, further comprising a plurality of single electrically conductive structures, each disposed between adjacent first and second electrically conductive sensor structures.

8. The capacitive sensing structure of claim 7, wherein the single electrically conductive structures are electrically floating with respect to the first electrically conductive sensor structures and second electrically conductive sensor structures.

9. The capacitive sensing structure of claim 7, wherein the single electrically conductive structures are disposed along at least a portion of a perimeter of one or more of the first electrically conductive sensor structures.

10. The capacitive sensing structure of claim 7, wherein the single electrically conductive structures are disposed along at least a portion of a perimeter of one or more of the second electrically conductive sensor structures.

11. The capacitive sensing structure of claim 7, wherein at least one of the first electrically conductive sensor structures, the second electrically conductive sensor structures, and the plurality of single electrically conductive structures is comprised of indium tin oxide.

12. The capacitive sensing structure of claim 1, wherein at least a portion of the plurality of open regions are formed between the first arm and second arm of one of the rows of first electrically conductive sensor structures.

13. The capacitive sensing structure of claim 1, wherein at least a portion of the plurality of open regions are formed between adjacent rows of the first electrically conductive sensor structures.

14. The capacitive sensing structure of claim 1, wherein the one of the first plurality of finger structures extends beyond the end portion.

15. The capacitive sensing structure of claim 1, wherein the one of the second plurality of finger structures extends beyond the end portion.

16. A capacitive sensing structure, comprising:
one or more rows of first electrically conductive sensor structures; and
a plurality of columns of second electrically conductive sensor structures, wherein each of the second electrically conductive sensor structures in a column are electrically coupled together;
wherein each row of the first electrically conductive sensor structures comprises:
a first arm extending in a first direction across each of the columns of second electrically conductive sensor structures, and the first arm having a first plurality of finger structures extending from the first arm along a second direction,
a second arm extending parallel to the first arm and across each of the columns of second electrically conductive sensor structures, the second arm having a second plurality of finger structures extending from the second arm along the second direction, and
an end portion located at a first end of the row of the first electrically conductive sensor structures and connecting the first and second arms of the first electrically conductive sensor structures, wherein the end portion integrates with one of the first plurality of finger structures and one of the second plurality of finger structures.

17. The capacitive sensing structure of claim 16, wherein the first direction is perpendicular to the second direction.

18. The capacitive sensing structure of claim 16, wherein at least the first arm, second arm, first plurality of finger structures, and second plurality of finger structures at least partially define a plurality of open regions.

19. The capacitive sensing structure of claim 18, wherein each of the second electrically conductive sensor structures comprise a shape disposed within one of the plurality of open regions, wherein the shape is at least partially defined by a perimeter of the one of the plurality of open regions.

20. The capacitive sensing structure of claim 18, wherein the shape of one or more of the second electrically conductive sensor structures includes one or more horizontal protrusions each disposed adjacent one or more of the finger structures and extending from the second electrically conductive sensor structure along the first direction.

21. The capacitive sensing structure of claim 18, wherein the shape of one or more of the second electrically conductive sensor structures further includes one or more vertical protrusions extending from the second electrically conductive sensor structure along the second direction.

22. The capacitive sensing structure of claim 21, wherein at least one of the first arm and second arm of the row of first electrically conductive sensor structures includes a tapered region disposed adjacent one or more of the vertical protrusions of the second electrically conductive sensor structures.

23. The capacitive sensing structure of claim 21, wherein the shape of one or more of the second electrically conductive sensor structures further includes an electrical bridge extending between, and electrically connecting, adjacent vertical protrusions of the second electrically conductive sensor structures.

24. The capacitive sensing structure of claim 16, further comprising a plurality of single electrically conductive structures, each disposed between adjacent first and second electrically conductive sensor structures, wherein the single electrically conductive structures are electrically floating with respect to the first electrically conductive sensor structures and second electrically conductive sensor structures.

25. The capacitive sensing structure of claim 24, wherein the single electrically conductive structures are disposed along at least a portion of a perimeter of one or more of the first electrically conductive sensor structures.

26. The capacitive sensing structure of claim 24, wherein the single electrically conductive structures are disposed along at least a portion of a perimeter of one or more of the second electrically conductive sensor structures.

27. The capacitive sensing structure of claim 16, wherein the one of the first plurality of finger structures and the one of the second plurality of finger structures extend beyond the end portion.

* * * * *